(12) United States Patent
Chen et al.

(10) Patent No.: US 12,369,308 B2
(45) Date of Patent: Jul. 22, 2025

(54) MEMORY DEVICE, AND SEMICONDUCTOR STRUCTURE AND FORMING METHOD THEREOF

(71) Applicant: CHANGXIN MEMORY TECHNOLOGIES, INC., Hefei (CN)

(72) Inventors: Longyang Chen, Hefei (CN); Zhongming Liu, Hefei (CN); Hongfa Wu, Hefei (CN); Gongyi Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 509 days.

(21) Appl. No.: 17/655,831

(22) Filed: Mar. 22, 2022

(65) Prior Publication Data
US 2022/0359526 A1 Nov. 10, 2022

(30) Foreign Application Priority Data

May 8, 2021 (CN) .......................... 202110501882.X

(51) Int. Cl.
*H10B 12/00* (2023.01)

(52) U.S. Cl.
CPC ........... *H10B 12/315* (2023.02); *H10B 12/03* (2023.02); *H10B 12/482* (2023.02)

(58) Field of Classification Search
CPC ...... H10B 12/00; H10B 12/03; H10B 12/315; H10B 12/482; H10B 12/0335; H10B 12/02; H10B 12/34; H10B 12/48; H10B 12/053; H10B 12/485; H10B 12/09; H10B 12/30; H10B 12/37; H10B 12/50; H10B 12/488
USPC .............................. 438/3, 239, 240, 243, 386
See application file for complete search history.

(56) References Cited

U.S. PATENT DOCUMENTS

| | | | |
|---|---|---|---|
| 2016/0276349 A1* | 9/2016 | Kwon | ..................... H10B 12/34 |
| 2019/0189620 A1 | 6/2019 | Wang et al. | |
| 2019/0333918 A1 | 10/2019 | Kim et al. | |

* cited by examiner

*Primary Examiner* — Chuong A Luu
(74) *Attorney, Agent, or Firm* — SYNCODA LLC; Feng Ma

(57) ABSTRACT

The present disclosure provides a memory device, and a semiconductor structure and a forming method thereof, which includes: providing a substrate, which includes a plurality of bit line structures, forming a cover layer on each of the bit line structures, forming a first insulating layer and a second insulating layer sequentially on a side wall of each cover layer, and filling a space between second insulating layers of two adjacent bit line structures with a conductive contact layer; tops of the conductive contact layers and the second insulating layers are all lower than surfaces of the cover layers and higher than surfaces of the bit line structures; tops of the first insulating layers are flush with those of the conductive contact layers and the second insulating layers; and etching back the conductive contact layers, to form a capacitor contact hole between cover layers of two adjacent bit line structures.

16 Claims, 7 Drawing Sheets

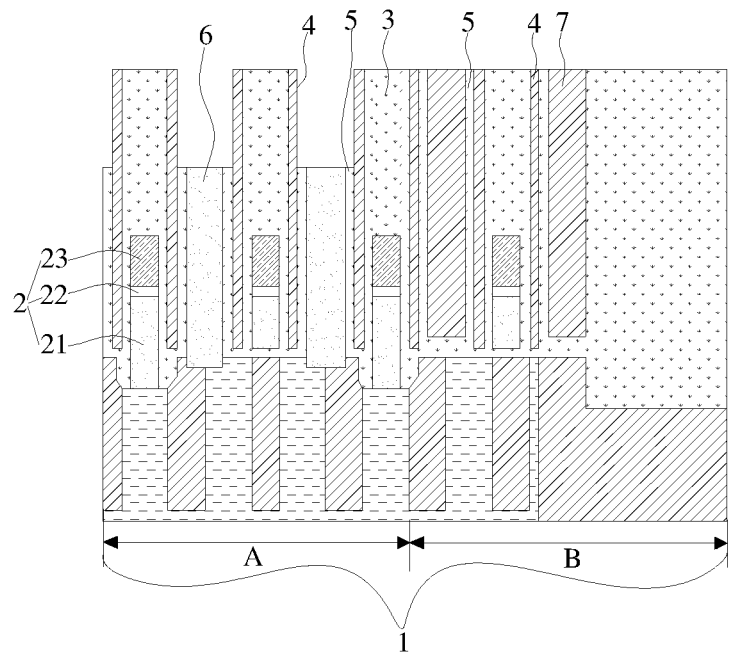

FIG. 4

```
Selectively etch the conductive contact layers, such that
the tops of the conductive contact layers are lower than the      ⸺ S1301
surfaces of the cover layers and higher than the surfaces of
              the bit line structures
```

```
Selectively etch the second insulating layers, such that the
 tops of the second insulating layers are flush with those of     ⸺ S1302
  the conductive contact layers, where etching rates of the
 conductive contact layers and the second insulating layers
are all greater than those of the insulating dielectric layers
```

MEMORY DEVICE, AND SEMICONDUCTOR STRUCTURE AND FORMING METHOD THEREOF

CROSS-REFERENCE TO RELATED APPLICATION

This application claims the priority of Chinese Patent Application No. 202110501882.X, submitted to the Chinese Intellectual Property Office on May 8, 2021, the disclosure of which is incorporated herein in its entirety by reference.

TECHNICAL FIELD

The present disclosure relates to the technical field of semiconductors, and in particular to a memory device, and a semiconductor structure and a forming method thereof.

BACKGROUND

Dynamic random access memories (DRAMs) feature a small size, high integration, and high transmission speed, and are thus widely applied to mobile devices such as mobile phones and tablet computers.

The existing DRAM includes bit lines and capacitor contact windows that are arranged alternately. However, during the forming of the bit lines and the capacitor contact windows, structural abnormalities are prone to occur, resulting in a low device yield.

It should be noted that the information disclosed above is merely intended to facilitate a better understanding of the background of the present application and therefore may include information that does not constitute the prior art known to those of ordinary skill in the art.

SUMMARY

According to an aspect of the present disclosure, a forming method of a semiconductor structure is provided, including:
  providing a substrate, where the substrate includes an array region;
  forming a plurality of bit line structures distributed at intervals in the array region, forming a cover layer on each of the bit line structures, forming a first insulating layer and a second insulating layer sequentially on a side wall of each of the cover layers, and filling a space between second insulating layers of two adjacent bit line structures with a conductive contact layer;
  etching the conductive contact layers and the second insulating layers, such that tops of the conductive contact layers and the second insulating layers are all lower than surfaces of the cover layers and higher than surfaces of the bit line structures;
  selectively etching the first insulating layers, such that tops of the first insulating layers are flush with the tops of the conductive contact layers and the second insulating layers; and
  etching back the conductive contact layers, to form a capacitor contact hole between cover layers of two adjacent bit line structures.

According to an aspect of the present disclosure, a semiconductor structure is provided, including:
  a substrate, where the substrate includes an array region;
  a plurality of bit line structures distributed at intervals in the array region, where a cover layer is formed on each of the bit line structures, and a first insulating layer and a second insulating layer are formed sequentially on a side wall of each of the cover layers; and
  a conductive contact layer, filling a space between second insulating layers of two adjacent bit line structures, where tops of the conductive contact layers, the first insulating layers and the second insulating layers are all lower than surfaces of the cover layers and higher than surfaces of the bit line structures, and a capacitor contact hole is formed between cover layers of two adjacent bit line structures.

According to an aspect of the present disclosure, a memory device is provided, including the semiconductor structure according to any one of the foregoing items.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure. Apparently, the accompanying drawings in the following description show merely some embodiments of the present disclosure, and those of ordinary skill in the art may still derive other accompanying drawings from these drawings without creative efforts.

FIG. 4 is a schematic diagram of a structure obtained after step S130 is completed according to an implementation of the present disclosure.

FIG. 5 is a flowchart of step S130 according to an implementation of the present disclosure.

DETAILED DESCRIPTION

Figure 1:
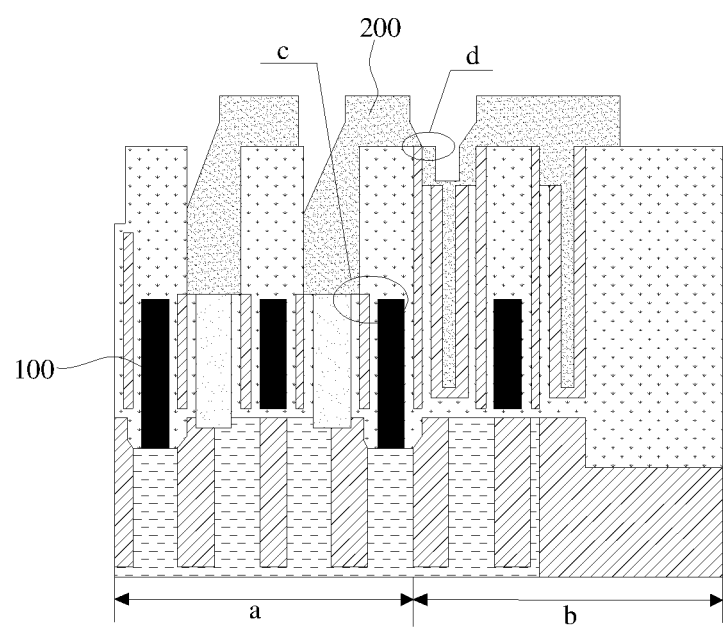
FIG. 1 is a schematic diagram of a semiconductor structure in the related art.

The exemplary implementations are described more comprehensively below with reference to the accompanying drawings. However, the exemplary implementations may be implemented in various forms, and may not be construed as being limited to those described herein. On the contrary, these implementations are provided to make the present disclosure comprehensive and complete and to fully convey the concept of the exemplary implementations to those skilled in the art. The same reference numerals in the figures indicate the same or similar structures, and thus their detailed descriptions are omitted.

Although relative terms such as "upper" and "lower" are used in this specification to describe the relative relationship of one component of an icon to another, these terms are used in this specification only for convenience, for example, according to the orientation of the examples described in the accompanying drawings. It can be understood that if the device of the icon is turned upside down, the components described as "upper" become the "lower" components. When a structure is "on" other structures, it may mean that the structure is integrally formed on other structures, or that the structure is "directly" disposed on other structures, or that the structure is "indirectly" disposed on other structures through another structure.

The terms "a", "an", "the", and "said" are used to indicate that there are one or more elements/components/etc. The terms "include" and "comprise" are used to mean open-ended inclusion and mean that there may be additional elements/components/etc. in addition to the listed elements/components/etc. The terms "first", "second" and "third" are used only as markers, not as a restriction on the number of objects.

In the related art, as shown in FIG. 1, a semiconductor structure mainly includes a substrate and a plurality of bit line structures 100 formed on the substrate. The bit line structures 100 are spaced by using an insulating material. During manufacturing, the insulating material needs to be etched to form capacitor contact holes, and the holes and bit line structures 100 are alternately distributed. Specifically, the substrate includes an array region a and a dummy pattern region b. The bit line structures 100 are distributed in the array region a and the dummy pattern region b. Each of the capacitor contact holes is formed between two bit line structures 100 in the array region a. The bit line structures 100 in the dummy pattern region b are spaced by using an insulating dielectric layer. In the process of forming the capacitor contact holes through etching, it is likely to damage the isolating interfaces between the capacitor contact holes and the bit line structures 100, thereby causing short circuit between capacitor contact structures 200 formed subsequently in the capacitor contact holes and the bit line structures 100 in a region c of the figure. In this case, in the process of forming the capacitor contact holes through etching, the insulating dielectric layers in the dummy pattern region b are etched synchronously, to form relatively deep holes. When the capacitor contact structures 200 are formed subsequently through filling with a conductive material, the holes are filled with the conductive material at the same time. However, due to the limitation of the manufacturing process, it is difficult to completely remove the conductive material, and short circuit is likely to occur to, in a region d, the capacitor contact structures 200 in the array region a and the conductive material in the holes of the dummy pattern region b, causing relatively low product yield.

Figure 2:
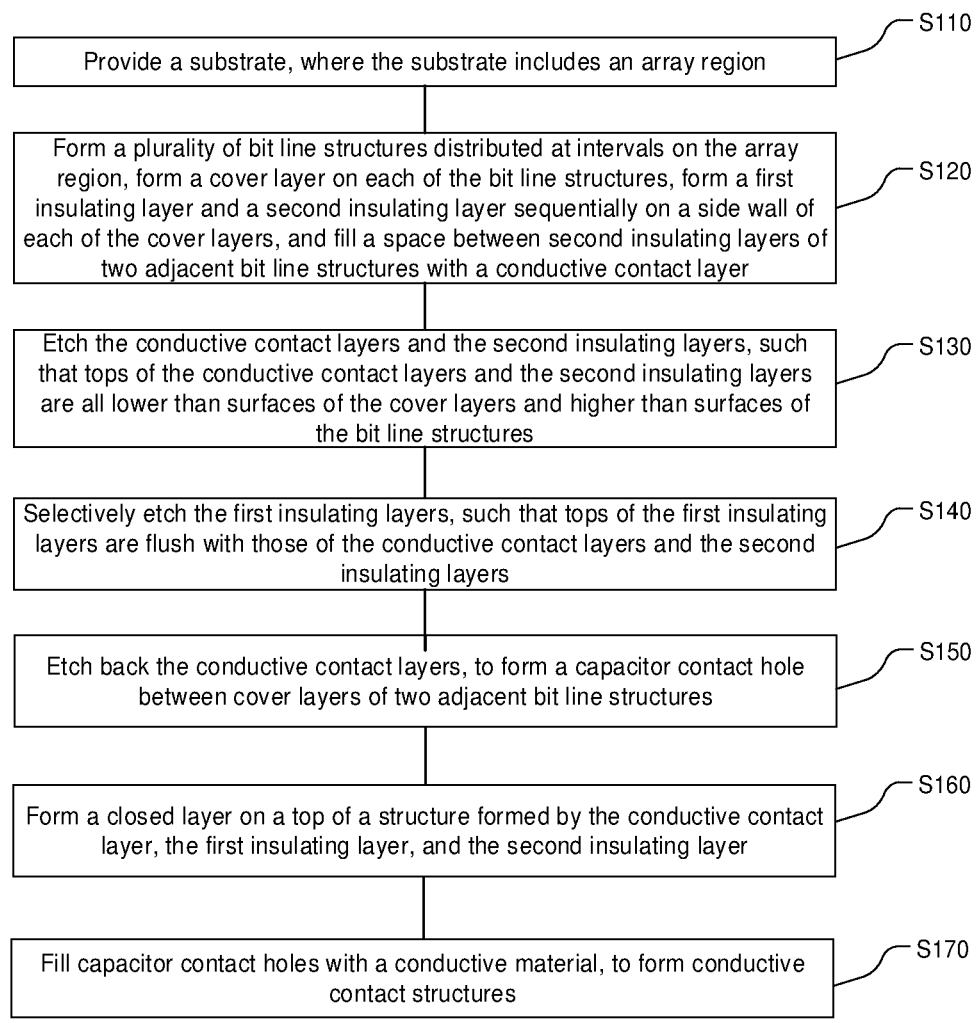
FIG. 2 is a flowchart of a forming method of a semiconductor structure according to an implementation of the present disclosure.

An implementation of the present disclosure provides a forming method of a semiconductor structure. As shown in FIG. 2, the forming method may include step S110 to step S150.

Step S110: Provide a substrate, where the substrate includes an array region.

Step S120: Form a plurality of bit line structures distributed at intervals on the array region, form a cover layer on each of the bit line structures, form a first insulating layer and a second insulating layer sequentially on a side wall of each of the cover layers, and fill a space between second insulating layers of two adjacent bit line structure with a conductive contact layer.

Step S130: Etch the conductive contact layers and the second insulating layers, such that tops of the conductive contact layers and the second insulating layers are all lower than surfaces of the cover layers and higher than surfaces of the bit line structures.

Step S140: Selectively etch the first insulating layers, such that tops of the first insulating layers are flush with those of the conductive contact layers and the second insulating layers.

Step S150: Etch back the conductive contact layers, to form a capacitor contact hole between cover layers of two adjacent bit line structures.

In the forming method of the semiconductor structure of the present disclosure, insulation protection can be performed on two sides of the bit line structures and the conductive contact layers by using the cover layers, the first insulating layers and the second insulating layers, to avoid short circuit between the bit line structures and the conductive contact layers, and reduce the risk of short circuit in devices. In the process of forming the structures, the conductive contact layers and the second insulating layers are etched first, and then the first insulating layers are selectively etched, to avoid the damage on the side walls of the cover layers in the process of etching the first insulating layers, and avoid short circuit between the conductive contact layers and the bit line structures through the damaged interfaces of the cover layers, and to improve the product yield. In this case, the conductive contact layers are etched back, such that the tops of the first insulating layers and the second insulating layers are higher than those of the conductive contact layers and the bit line structures, to form relatively high isolation barriers between the conductive contact layers and the bit line structures, increase the isolation effect, and further decrease the short-circuit risk of the conductive contact layers and the bit line structures.

The steps of the forming method of a semiconductor structure in this implementation of the present disclosure are described in detail below.

As shown in FIG. 2, in step S110, a substrate is provided, and the substrate includes an array region.

Figure 3:
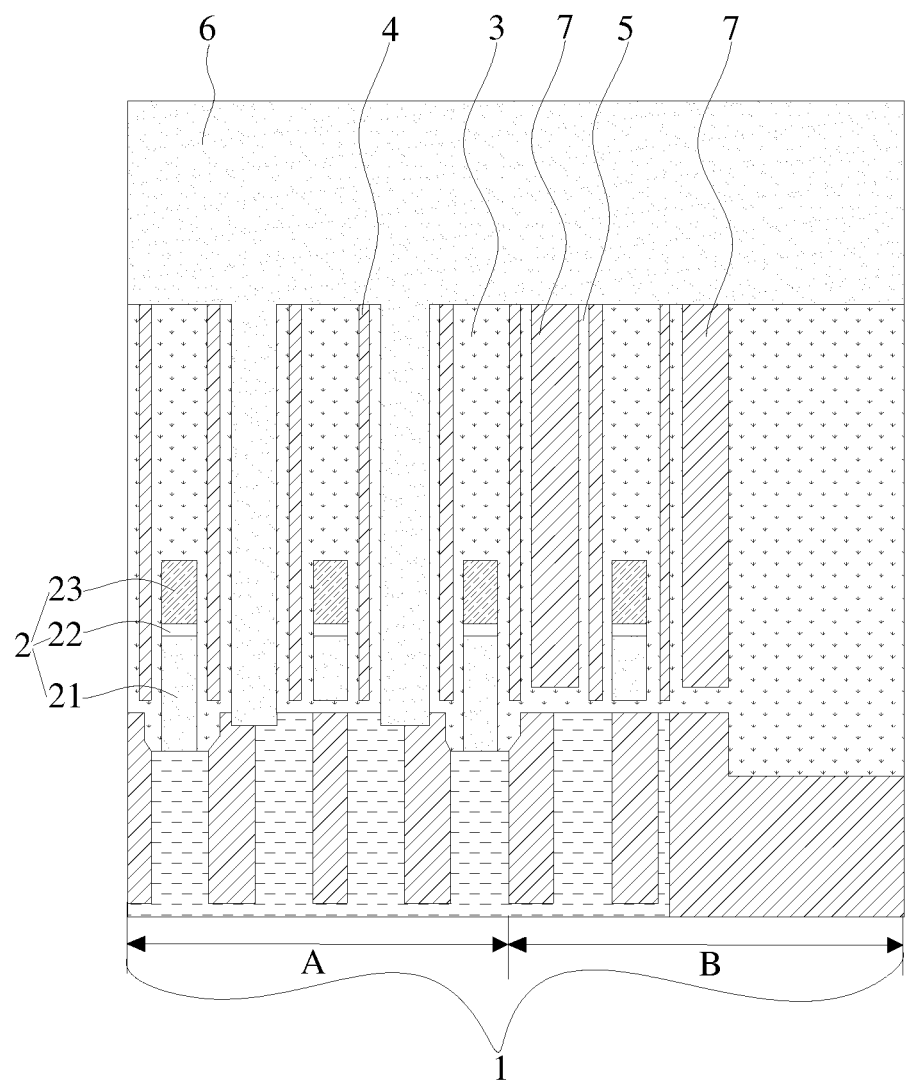
FIG. 3 is a schematic diagram of a structure obtained after step S120 is completed according to an implementation of the present disclosure.

As shown in FIG. 3, the substrate 1 may be of a flat plate structure. The substrate 1 includes word line structures (not shown in the figure). The formation region of the bit line structures 2 and the formation region of the capacitor contact holes may be pre-defined on the substrate 1. The substrate 1 may be a rectangle, a circle, an ellipse, a polygon or an irregular shape. The substrate may be made of silicon or another semiconductor material. The shape and material of the substrate 1 are not particularly limited thereto.

The substrate 1 may have an array region A, which can be used to form a capacitor array and the bit line structures 2. The array region A may be circular, rectangular or irregular, which is not particularly limited thereto. In an exemplary implementation of the present disclosure, the substrate 1 may further include a dummy pattern region B. The dummy pattern region B may be distributed next to the array region A. For example, the dummy pattern region B may be circular, and may surround the periphery of the array region A. For example, the dummy pattern region B may be a circular ring region, a rectangular ring region or an irregular pattern region, which is not particularly limited thereto. The dummy pattern region B may be used to form a dummy pattern, and the addition of the dummy pattern can improve the pattern density and avoid structural defects caused by the difference in pattern density during the manufacturing.

As shown in FIG. 2, in step S120, the plurality of bit line structures distributed at intervals are formed in the array region. The cover layer is formed on each of the bit line structures. The first insulating layer and the second insulating layer are formed sequentially on the side wall of each of the cover layers. The conductive contact layer fills a space between second insulating layers of two adjacent bit line structures.

A sacrificial layer may be formed on the surface of the substrate 1, and its thickness may be the same as the required thickness of the bit line structures 2. The sacrificial layer may be formed on the substrate 1 through atomic layer deposition, vacuum evaporation, magnetron sputtering, chemical vapor deposition, physical vapor deposition, or the like. Certainly, the sacrificial layer may also be formed on the substrate 1 through another process. The forming process of the sacrificial layer is not particularly limited thereto.

The sacrificial layer may be patterned through a photolithography process according to the pre-defined bit line formation region and the capacitor contact structure formation region, to form a plurality of trenches and a plurality of through holes distributed side by side in the sacrificial layer. It may be noted that the trenches may be at least distributed in the array region A and, meanwhile, in the dummy pattern region B, which is not particularly limited thereto.

In a direction perpendicular to the substrate 1, the trenches may pass through at all ends, may be strip-shaped in a direction parallel to the substrate 1, and may extend in the direction parallel to the substrate 1. The through holes may be circular, rectangular or irregular, which is not particularly limited thereto.

There may be a plurality of through holes. They may be arranged in a column and may be arranged at intervals along an extension direction of the trenches. In an implementation, each trench and each column of through holes may form a set. A plurality of sets of trenches and through holes distributed side by side may be formed. Moreover, the columns formed by trenches and through holes in two adjacent sets are distributed alternatively, that is, the through holes are distributed on two sides of each of the trenches, and may be set at intervals along the extension direction of the trench.

The second insulating layer 5 may be formed on a side wall of each of the trenches. The second insulating layer 5 may be a film or a coating attached to the side wall of the trench, which is not particularly limited thereto. The second insulating layer 5 may be made of an insulating material, to insulate and protect the structure in each trench and prevent a short circuit of the structure. For example, the material may be silicon nitride. In an example, the second insulating layer 5 may be formed on the side wall of each of the trenches through chemical vapor deposition, physical vapor deposition, thermal evaporation, atomic layer deposition, or the like. Certainly, the second insulating layer 5 may be formed through another process, which is not particularly limited thereto.

The first insulating layer 4 may be formed on the surface, of the second insulating layer 5, away from the side wall of each of the trenches. The first insulating layer 4 may be a film or a coating attached to the surface of the second insulating layer 5, which is not particularly limited thereto. The first insulating layer 4 may be made of an insulating material, such that the structures in each trench can be double-insulated and protected by using the first insulating layer 4 and the second insulating layer 5 to further prevent short circuit of the structures. For example, the first insulating layers 4 may be made of silicon oxide. In an example, the first insulating layer 4 may be formed on the surface of the second insulating layer 5 through chemical vapor deposition, physical vapor deposition, thermal evaporation, or atomic layer deposition. Certainly, the first insulating layer 4 may be formed through another process, which is not particularly limited thereto.

The bit line structures 2 may be formed respectively in each trench, and may be made of a conductive material. For example, the bit line structures 2 may include a first conductive layer 21, a second conductive layer 22 and a third conductive layer 23 distributed in a stack. The first conductive layer 21 may be formed on the surface of the substrate 1, and may be made of polysilicon. The second conductive layer 22 may be formed on the surface, of the first conductive layer 21, away from the substrate 1, and may be made of titanium nitride. The third conductive layer 23 may be formed on the surface, of the second conductive layer 22, away from the substrate 1, and may be made of tungsten.

The cover layers 3 may be formed on the surface of the bit line structures 2 through chemical vapor deposition, physical vapor deposition, thermal evaporation, atomic layer deposition or the like. For example, the cover layers 3 may cover the side walls and tops of the bit line structures 2, and fill the gap between the bit line structures 2 and the first insulating layers 4. That is, the first insulating layers 4 and the second insulating layers 5 are distributed on the side walls of the cover layers 3. The cover layer 3 may be made of an insulating material, such that two adjacent bit line structures 2 can be triple-insulated and protected by using the cover layer 3, the first insulating layer 4 and the second insulating layer 5 to prevent short circuit from occurring between the bit line structures 2 and other surrounding structures, thereby reducing the risk of short circuit of the device. The cover layer 3 and the second insulating layer 5 may be made of the same material such as silicon nitride, and certainly, may be made of another insulating material, which is not listed herein.

In an exemplary implementation of the present disclosure, a conductive material may be deposited in each through hole in the array region A, thereby forming the conductive contact layer 6. As shown in FIG. 3, the conductive contact layer 6 may fill a space between second insulating layers 5 of two adjacent bit line structures 2. For example, the conductive material may be polysilicon. The conductive contact layer 6 may be formed in each through hole through vacuum evaporation, magnetron sputtering, chemical vapor deposition, physical vapor deposition, thermal evaporation, atomic layer deposition or the like. Certainly, the conductive contact layer 6 may be also formed through another process, which is not listed herein.

After the conductive contact layer 6 is formed, the sacrificial layer may be removed. For example, an acid solution may be used for wet etching. In use, the preparation ratio of acid solution to deionized water may be set according to the specific material of the sacrificial layer. The ratio and concentration of the etching solution are not particularly limited thereto.

The bit line structures 2 formed in the dummy pattern region B may be used as the dummy bit line structures 2. The addition of the dummy bit line structures 2 can improve the density of the bit line structures 2 in the manufacturing process, and avoid structural defects due to the density difference of the bit line structures 2 in the manufacturing process. During the product manufacturing process, the cover layer 3, the first insulating layer 4 and the second insulating layer 5 may be formed on the dummy bit line structure 2 at the same time. The difference between the structures formed on the dummy pattern region B and the structures formed in the array region A is that the conductive contact layer 6 fills a space between two adjacent bit line structures 2 in the array region A, while the insulating dielectric layer 7 fills a space between two adjacent dummy bit line structures 2 in the dummy pattern region B. The insulating dielectric layer 7 can completely fill the gap between second insulating layers 5 of two adjacent dummy bit line structures 2. In an exemplary implementation of the present disclosure, the insulating dielectric layer 7 and the first insulating layer 4 may be made of the same material such as silicon oxide. The structure obtained after step S120 is completed is shown in FIG. 3.

As shown in FIG. 2, in step S130, the conductive contact layers and the second insulating layers are etched, such that tops of the conductive contact layers and the second insulating layers are all lower than surfaces of the cover layers and higher than surfaces of the bit line structures.

The structures on the surface of the substrate 1 may be flattened, to obtain a relatively flat surface. Non-isotropic etching may be performed on the conductive contact layers 6 and the second insulating layers 5 in the array region A through the dry etching process, such that the tops of the conductive contact layers 6 and the second insulating layers 5 in the array region A are all lower than the surfaces of the cover layers 3. In this process, the etching time may be controlled, such that the surfaces of the conductive contact layers 6 are higher than those of the bit line structures 2. For example, after the non-isotropic etching, the tops of the conductive contact layers 6 and the second insulating layers 5 may be higher than the surfaces of the bit line structures 2 by 5 nm to 25 nm. The structure obtained after step S130 is shown in FIG. 4.

In an exemplary implementation of the present disclosure, the conductive contact layers 6 and the second insulating layers 5 are etched, such that the tops of the conductive contact layers 6 and the second insulating layers 5 are lower than the surfaces of the cover layers 3, and higher than the surfaces of the bit line structures 2, that is, as shown in FIG. 5, step S130 may include step S1301 and step S1302.

Step S1301: Selectively etch the conductive contact layers, such that the tops of the conductive contact layers are lower than the surfaces of the cover layers and higher than the surfaces of the bit line structures.

The conductive contact layers 6 may be selectively etched through the selective etching process, such that the tops of the conductive contact layers 6 are lower than the surfaces of the cover layers 3 and higher than the surfaces of the bit line structures 2. In this process, the etching gas may be properly set according to the material property of the conductive contact layers 6, such that structures of other film layers are not damaged when the conductive contact layers 6 are etched. The etching gas may be defined as a first etching gas. An etching rate at which the conductive contact layers 6 are etched by using the first etching gas is far greater than the etching rates of the other film layers. For example, the etching rate at which the conductive contact layers 6 are etched by using the first etching gas is far greater than the etching rate of another insulating dielectric layer 7, and therefore, when the conductive contact layers 6 are etched, the surface of the insulating dielectric layer 7 is not damaged, and no relatively deep holes are formed in the dummy pattern region B. For example, when the conductive contact layer 6 is made of polysilicon, the first etching gas may be one of a chlorine gas and a bromine gas or a mixed gas of a plurality of gases.

Step S1302: Selectively etch the second insulating layers, such that the tops of the second insulating layers are flush with those of the conductive contact layers, where etching rates of the conductive contact layers and the second insulating layers are all greater than those of the insulating dielectric layers.

The second insulating layers 5 in the array region A are selectively etched through the selective etching process. For example, the non-isotropic etching may be performed on the second insulating layers 5 exposed from the side walls of the cover layers 3 in the array region A through the dry etching process, such that the tops of the second insulating layers 5 in the array region A are flush with the tops of the conductive contact layers 6. In this process, the etching gas may be properly set according to the material property of the second insulating layers 5, such that structures of other film layers are not damaged when the second insulating layers 5 are etched. The etching gas may be defined as a second etching gas. An etching rate at which the second insulating layers 5 are etched by using the second etching gas is far greater than the etching rates of the other film layers. For example, the etching rate at which the second insulating layers 5 are etched by using the second etching gas is far greater than the etching rate of the insulating dielectric layer 7, and therefore, when the conductive contact layers 6 are etched, the surface of the insulating dielectric layer 7 in the dummy pattern region B is not damaged, and no relatively deep holes are formed in the dummy pattern region B. For example, when the second insulating layer 5 is made of silicon nitride, the second etching gas may be a fluorine-including gas or a mixed gas of a fluorine-including gas and an inert gas. For example, the second etching gas may be $CH_2F_2$, $CH_3F$, $CHF_3$, or may be a mixed gas of at least one of $CH_2F_2$, $CH_3F$ or $CHF_3$ with argon, which is not particularly limited thereto.

As shown in FIG. 2, in step S140, the first insulating layers are selectively etched, such that tops of the first insulating layers are flush with those of the conductive contact layers and the second insulating layers.

Figure 6:
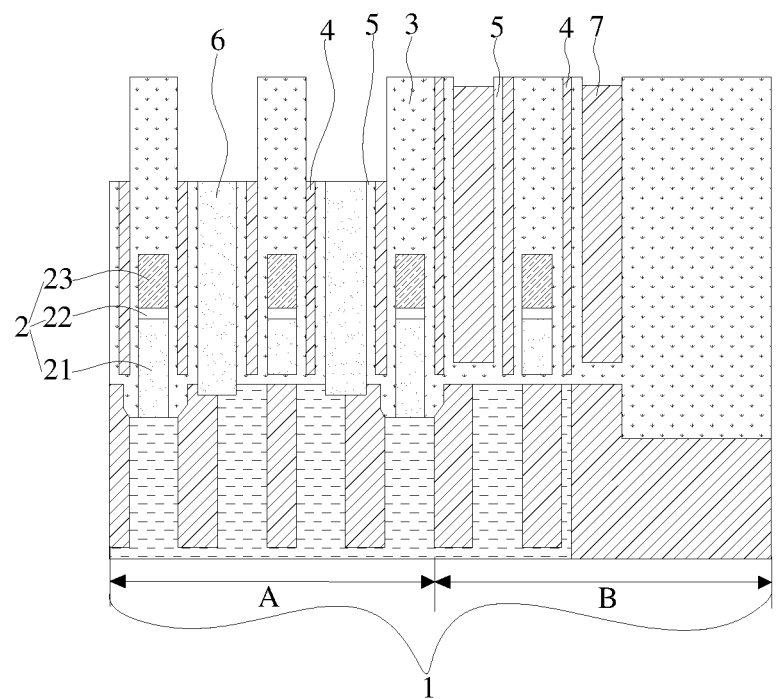
FIG. 6 is a schematic diagram of a structure obtained after step S140 is completed according to an implementation of the present disclosure.

A part of the first insulating layers 4 on the side walls of the cover layers 3 in the array region A may be removed through the wet etching process. For example, the wet etching may be performed on the first insulating layers 4 exposed from the side walls of the cover layers 3 in the array region A. In another example, the wet etching may be performed on the first insulating layers 4 in the array region A by using an acid solution, such that the tops of the first insulating layers 4 are flush with the tops of the conductive contact layers 6 and the second insulating layers 5. The etching rate of the first insulating layers 4 may be controlled by controlling the dilution ratio of the acid solution, and the etching depth of the first insulating layers 4 is controlled by controlling the etching time. The structure obtained after step S140 is shown in FIG. 6.

In an exemplary implementation of the present disclosure, the acid solution may be hydrofluoric acid. For example, it may be buffered hydrofluoric acid (BHF), 49% hydrofluoric acid, or dilute hydrofluoric acid (DHF). In use, the preparation ratio of the acid solution to deionized water may be set according to the specific material of the first insulating layer 4. For example, when the material of the first insulating layer 4 is silicon oxide, the preparation ratio of the acid solution to deionized water may be less than 1:30, and the wet etching lasts for less than 2 min. When the materials of the insulating dielectric layer 7 in the dummy pattern region B and the first insulating layer 4 are the same. When the first insulating layer 4 is etched, due to the relatively small thickness of the first insulating layer 4 and the relatively short etching time, during the etching, only a small amount of the surface of the insulating dielectric layer 7 in the dummy pattern region B is removed, such that no deep holes are formed in the dummy pattern region B, and the semiconductor structure formed finally does not have the problem of uneven structure distribution in each region.

As shown in FIG. 2, in step S150, the conductive contact layers are etched back, to form a capacitor contact hole between cover layers of two adjacent bit line structures.

The conductive contact layers 6 may be etched back, such that the tops of the first insulating layers 4 and the second insulating layers 5 are higher than the surfaces of the bit line structures 2 and higher than the surfaces of the conductive contact layers 6, to form a relatively high isolation barrier between the bit line structures 2 and the conductive contact layers 6, increase the effect of isolation of the bit line structures 2 from the conductive contact layers 6, and decrease the risk of short circuit in the conductive contact layers 6 and the bit line structures 2. In this case, after the conductive contact layers 6 are etched back, the capacitor contact hole 31 may be formed between cover layers 3 of two adjacent bit line structures 2, such that the conductive contact structures are formed subsequently. For example, the conductive contact layers 6 may be selectively etched through the dry etching process. Certainly, the conductive contact layers 6 may be also etched back through another process, provided that the other film layers are not damaged, which is not particularly limited thereto.

Figure 7:
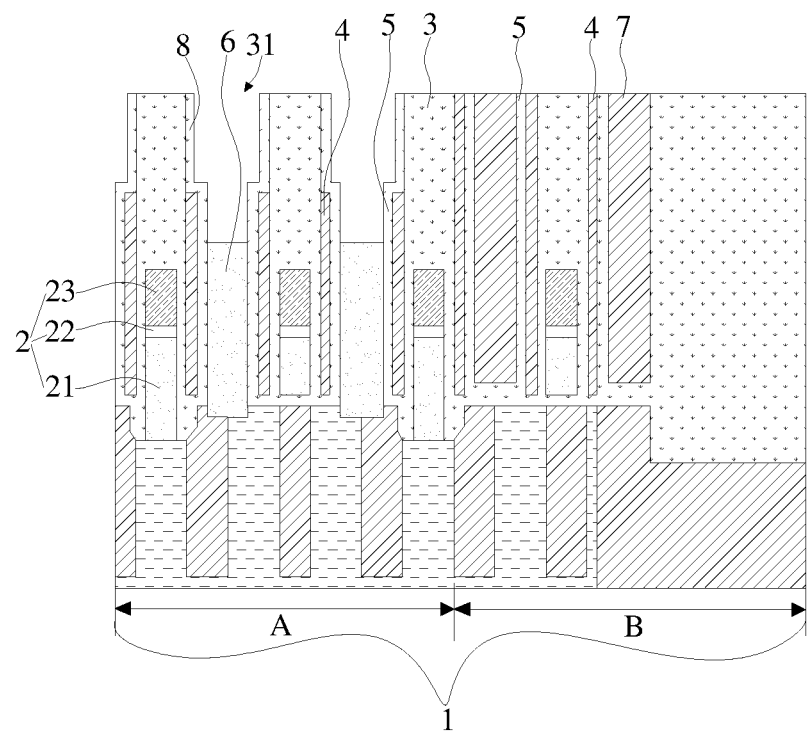
FIG. 7 is a schematic diagram of a structure obtained after step S150 is completed according to an implementation of the present disclosure.

In an exemplary implementation of the present disclosure, after the conductive contact layers 6 are etched back, in a direction perpendicular to the substrate 1, the tops of the conductive contact layers 6 may be at a different height from the surfaces of the bit line structures 2, to reduce the risk of short circuit between the tops of the bit line structures 2 and the tops of the conductive contact layers 6. The structure obtained after step S150 is shown in FIG. 7.

For example, the tops of the first insulating layers 4 and the second insulating layers 5 may be higher than the surfaces of the bit line structures 2 by a first preset distance, while the tops of the conductive contact layers 6 may be higher than the surfaces of the bit line structures 2 by a second preset distance. The first preset distance may be greater than the second preset distance. In an exemplary implementation of the present disclosure, the first preset distance may be 5 nm to 25 nm such as 5 nm, 10 nm, 15 nm, 20 nm or 25 nm. The second preset distance may be 0 nm to 15 nm such as 0 nm, 5 nm, 10 nm or 15 nm.

In an exemplary implementation of the present disclosure, after the conductive contact layers 6, the first insulating layers 4, and the second insulating layers 5 are etched, the forming method of the present disclosure may further include:

Step S160: Form a closed layer on a top of a structure formed by the conductive contact layer, the first insulating layer, and the second insulating layer.

Figure 8:
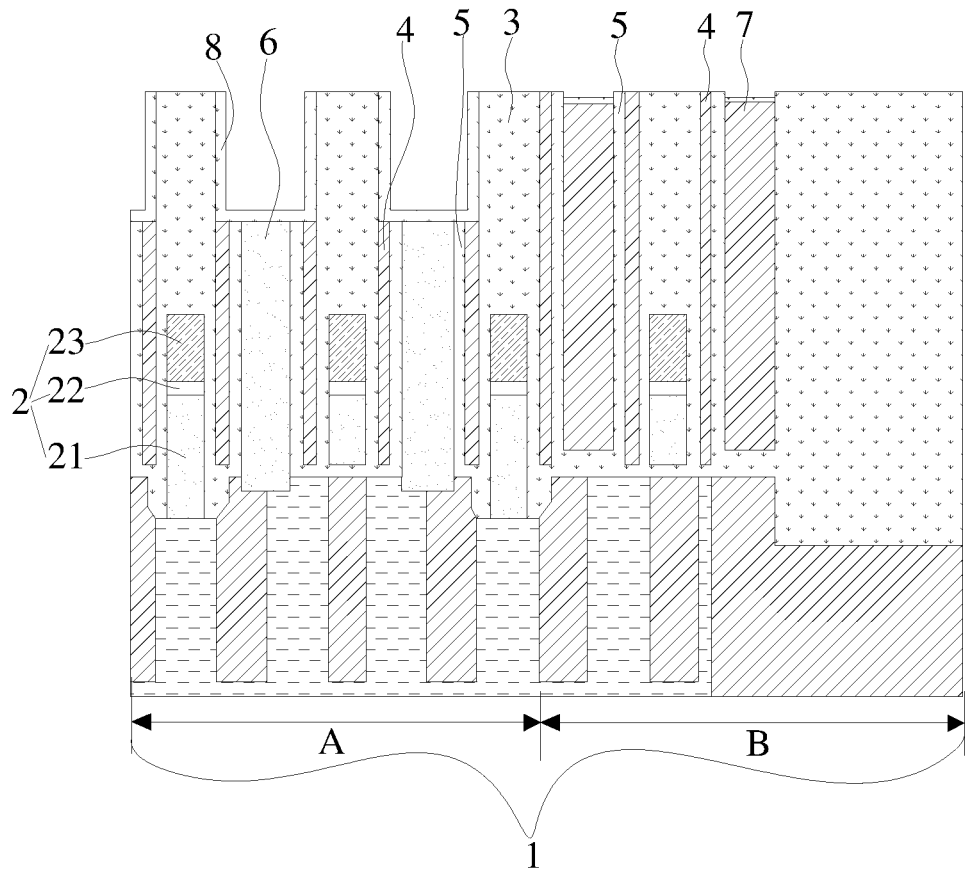
FIG. 8 is a schematic diagram of a structure obtained after step S160 is completed according to an implementation of the present disclosure.

A closed layer 8 may be formed on the top of the structure formed by the conductive contact layer 6, the first insulating layer 4, and the second insulating layer 5. Materials of the closed layer 8, the cover layer 3, and the second insulating layer 5 may be the same. For example, the material may be silicon nitride. The top of the first insulating layer 4 may be sealed by using the closed layer 8, to increase the structure strength, and avoid that the isolation effect of the first insulating layers 4 and the second insulating layers 5 on the conductive contact layers 6 and the bit line structures 2 is reduced due to the insufficient material strength of the first insulating layers 4. The structure obtained after step S160 is shown in FIG. 8.

For example, the closed layer 8 may be formed on the surface of the structure formed by the conductive contact layer 6, the first insulating layer 4, and the second insulating layer 5 through chemical vapor deposition, physical vapor deposition, thermal evaporation, atomic layer deposition or the like. Certainly, the closed layer 8 may be also formed through another process, which is not listed herein.

Figure 9:
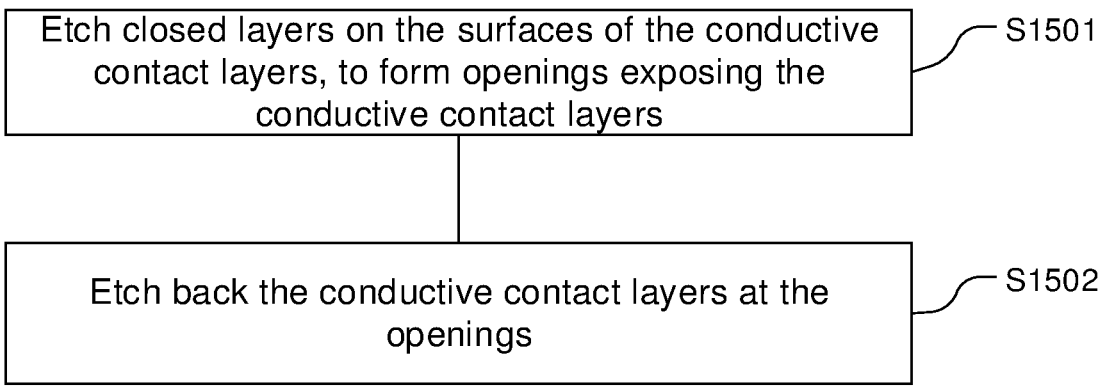
FIG. 9 is a flowchart of step S150 according to an implementation of the present disclosure.

In an exemplary implementation of the present disclosure, after closed layers 8 are formed, the conductive contact layers 6 are etched back, to form the capacitor contact hole 31 between second insulating layers 5 of two adjacent bit line structures 2, that is, as shown in FIG. 9, step S150 may include step S1501 and step S1502.

Step S1501: Etch closed layers on the surfaces of the conductive contact layers, to form openings exposing the conductive contact layers.

Closed layers 8 on the surfaces of the conductive contact layers 6 may be etched through the dry etching process, to form the openings exposing the tops of the conductive contact layers 6. The openings and the tops of the conductive contact layers 6 are in the same shape. The size of the opening is equal to that of the surface of the conductive contact layer 6.

Step S1502: Etch back the conductive contact layers at the openings.

The conductive contact layers 6 may be etched back at the openings, such that the tops of the conductive contact layers 6 are lower than the tops of the first insulating layers 4 and the second insulating layers 5, while the tops of the conductive contact layers 6 may be higher than the surfaces of the bit line structures 2 by controlling the etching rate and time.

In an exemplary implementation of the present disclosure, the forming method of the present disclosure may further include:

Step S170: Fill the capacitor contact holes with a conductive material, to form conductive contact structures.

A conductive metal may be deposited on the surface of the cover layer 3 through atomic layer deposition, vacuum evaporation, magnetron sputtering, chemical vapor deposition, physical vapor deposition or the like to form the conductive layer. In this process, the conductive metal may fill up all the capacitor contact holes 31. Because the tops of the first insulating layers 4 and the second insulating layers 5 are higher than the tops of the bit line structures 2, a relatively high isolation barrier is formed between the conductive metal and the bit line structures 2, to strength the isolation effect and decrease the risk of short circuit in the conductive metal and the bit line structures 2. In this case, because no relatively deep holes are formed in the dummy pattern region B in the pre-fabrication process, when the conductive metal fills the holes, the conductive metal is not short-circuited because another conductive metal fills the holes, to further improve the product yield. The conductive metal may be a metal material with better conductivity, such as the metal tungsten. Certainly, it may be another metal with better conductivity, which is not listed herein.

Figure 10:
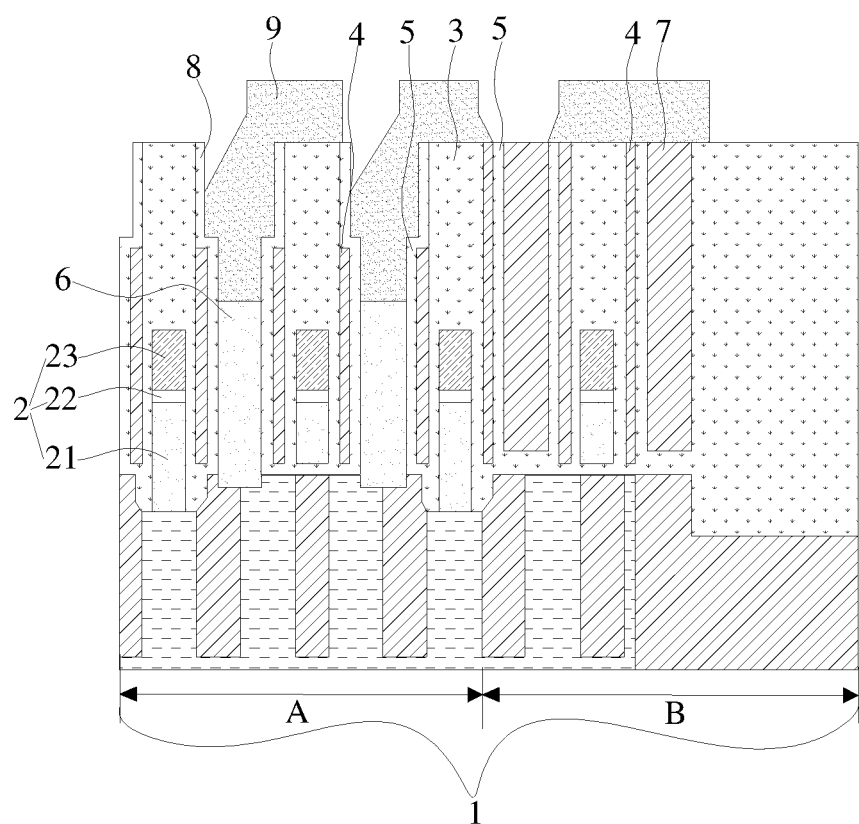
FIG. 10 is a schematic diagram of a structure obtained after step S170 is completed according to an implementation of the present disclosure.

The conductive layers may be etched, such that the conductive layers in the capacitor contact holes 31 are disconnected from each other and do not interfere with each other, and conductive contact structures 9 that correspond to one by one and are connected to the conductive contact layers 6 formed in the capacitor contact holes 31. The conductive contact structures 9 may be used as contact structures of capacitors, to store the charge collected in the capacitors. The structure obtained after step S170 is shown in FIG. 10.

It should be noted that although the steps of the forming method of the semiconductor structure in the present disclosure are described in the accompanying drawings in a particular sequence, it is not required or implied that the steps must be performed in that particular sequence or that all of the steps shown must be performed to achieve the desired results. Additionally or alternatively, some steps may be omitted, a plurality of steps may be combined into a single step for execution, and/or a single step may be divided into a plurality of steps for execution.

As shown in FIG. 7, an implementation of the present disclosure further provides a semiconductor structure, which may include a substrate 1, a plurality of bit line structures 2 and conductive contact layers 6.

The substrate 1 includes an array region A.

The plurality of bit line structures 2 are distributed at intervals in the array region A, a cover layer 3 is formed on each of the bit line structures 2, a first insulating layer 4 and a second insulating layer 5 are formed sequentially on a side wall of each of the cover layers 3.

The conductive contact layer 6 fills a space between second insulating layers 5 of two adjacent bit line structures 2. Tops of the conductive contact layers 6, the first insulating layers 4 and the second insulating layers 5 are all lower than surfaces of the cover layers 3 and higher than surfaces of the bit line structures 2. A capacitor contact hole 31 is formed between cover layers 3 of two adjacent bit line structures 2.

The specific details, forming process, and beneficial effects of the part in the semiconductor structure have been described in detail in the corresponding forming method of the semiconductor structure. Therefore, details are not described herein again.

An embodiment of the present disclosure further provides a memory device, which may include the semiconductor structure according to any one of the foregoing implementations and capacitors in contact and connection with the capacitor contact structures in the semiconductor structure. The conductive contact structures may store the charge collected in the capacitors. Reference may be made to the forming method of the semiconductor structure in the foregoing implementations for the beneficial effects of the memory device, which is not described in detail herein.

For example, the memory device may be a DRAM, or certainly, may be other storage apparatuses, which is not listed herein.

Those skilled in the art may easily figure out other implementations of the present disclosure after considering the specification and practicing the invention disclosed herein. The present application is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

The invention claimed is:

1. A forming method of a semiconductor structure, comprising:
   providing a substrate, wherein the substrate comprises an array region;
   forming a plurality of bit line structures distributed at intervals in the array region, forming a cover layer on each of the bit line structures, forming a first insulating layer and a second insulating layer sequentially on a side wall of each of the cover layers, and filling a space between second insulating layers of two adjacent bit line structures with a conductive contact layer;
   etching the conductive contact layers and the second insulating layers, such that tops of the conductive contact layers and the second insulating layers are all lower than surfaces of the cover layers and higher than surfaces of the bit line structures;
   selectively etching the first insulating layers, such that tops of the first insulating layers are flush with the tops of the conductive contact layers and the second insulating layers; and
   etching back the conductive contact layers, such that the tops of the conductive contact layers are lower than the tops of the first insulating layers and the second insulating layers, to form a capacitor contact hole between cover layers of two adjacent bit line structures.

2. The forming method according to claim 1, wherein the substrate further comprises a dummy pattern region, dummy bit line structures are formed in the dummy pattern region, the cover layers are formed on the dummy bit line structures, the first insulating layer and the second insulating layer are formed sequentially on a side wall of each of the cover layers, and an insulating dielectric layer fills a space between second insulating layers of two adjacent dummy bit line structures;
   the etching the conductive contact layers and the second insulating layers, such that tops of the conductive contact layers and the second insulating layers are all lower than surfaces of the cover layers and higher than surfaces of the bit line structures comprises:
   selectively etching the conductive contact layers, such that the tops of the conductive contact layers are lower than the surfaces of the cover layers and higher than the surfaces of the bit line structures; and
   selectively etching the second insulating layers, such that the tops of the second insulating layers are flush with the tops of the conductive contact layers, wherein etching rates of the conductive contact layers and the second insulating layers are all greater than etching rates of the insulating dielectric layers.

3. The forming method according to claim 1, wherein after the conductive contact layers are etched back, the tops of the first insulating layers and the second insulating layers are higher than the surfaces of the bit line structures by a first preset distance, the tops of the conductive contact layers are higher than the surfaces of the bit line structures by a second preset distance, and the first preset distance is greater than the second preset distance.

4. The forming method according to claim 3, wherein the first preset distance is 5 nm to 25 nm, and the second preset distance is 0 nm to 15 nm.

5. The forming method according to claim 2, wherein the first insulating layer is made of the same material as the insulating dielectric layer.

6. The forming method according to claim 5, wherein the selectively etching the first insulating layers, such that tops of the first insulating layers are flush with the tops of the conductive contact layers and the second insulating layers comprises:
   performing wet etching on the first insulating layers in the array region by using an acid solution.

7. The forming method according to claim 6, wherein the acid solution is diluted hydrofluoric acid, and the wet etching lasts for less than 2 min.

8. The forming method according to claim 1, wherein after the conductive contact layers, the first insulating layers and the second insulating layers are etched, the forming method further comprises:

forming a closed layer on a top of a structure formed by the conductive contact layer, the first insulating layer, and the second insulating layer; and the etching back the conductive contact layers, to form a capacitor contact hole between second insulating layers of two adjacent bit line structures comprises:

etching closed layers on the surfaces of the conductive contact layers, to form openings exposing the conductive contact layers; and etching back the conductive contact layers at the openings.

9. The forming method according to claim 1, wherein the forming method further comprises:

filling capacitor contact holes with a conductive material, to form conductive contact structures.

10. A semiconductor structure, comprising:

a substrate, wherein the substrate comprises an array region;

a plurality of bit line structures distributed at intervals in the array region, wherein a cover layer is formed on each of the bit line structures, and a first insulating layer and a second insulating layer are formed sequentially on a side wall of each of the cover layers; and a conductive contact layer, filling a space between second insulating layers of two adjacent bit line structures, wherein tops of the conductive contact layers, the first insulating layers and the second insulating layers are all lower than surfaces of the cover layers and higher than surfaces of the bit line structures, the tops of the conductive contact layers are lower than the tops of the first insulating layers and the second insulating layers, and a capacitor contact hole is formed between cover layers of two adjacent bit line structures.

11. The semiconductor structure according to claim 10, wherein the substrate further comprises a dummy pattern region, dummy bit line structures are formed in the dummy pattern region, the cover layers are formed on the dummy bit line structures, the first insulating layer and the second insulating layer are formed sequentially on a side wall of each of the cover layers, and an insulating dielectric layer fills a space between second insulating layers of two adjacent dummy bit line structures.

12. The semiconductor structure according to claim 10, wherein the tops of the first insulating layers and the second insulating layers are higher than the surfaces of the bit line structures by a first preset distance, the tops of the conductive contact layers are higher than the surfaces of the bit line structures by a second preset distance, and the first preset distance is greater than the second preset distance.

13. The semiconductor structure according to claim 12, wherein the first preset distance is 5 nm to 25 nm, and the second preset distance is 0 nm to 15 nm.

14. The semiconductor structure according to claim 10, the semiconductor structure further comprises:

a closed layer, located on a top of a structure formed by the first insulating layer and the second insulating layer.

15. The semiconductor structure according to claim 10, the semiconductor structure further comprises:

conductive contact structures, formed in the capacitor contact holes.

16. A memory device, comprising the semiconductor structure according to claim 10.

* * * * *